United States Patent
Shin et al.

(10) Patent No.: US 8,647,926 B2
(45) Date of Patent: *Feb. 11, 2014

(54) METHOD OF FABRICATING SEMICONDUCTOR PLASTIC PACKAGE INCLUDING A CORE BOARD, BUILD-UP INSULATION LAYER, PRINTED CIRCUIT, AND SEMICONDUCTOR CHIP

(75) Inventors: Joon-Sik Shin, Suwon-si (KR); Nobuyuki Ikeguchi, Suwon-si (KR); Keungjin Sohn, Seoul (KR); Joung Gul Ryu, Seoul (KR); Sang-Youp Lee, Seoul (KR); Jung-Hwan Park, Seongnam-si (KR); Ho-Sik Park, Hwaseong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/923,081

(22) Filed: Aug. 31, 2010

(65) Prior Publication Data

US 2010/0330747 A1    Dec. 30, 2010

Related U.S. Application Data

(62) Division of application No. 12/216,375, filed on Jul. 2, 2008, now Pat. No. 7,893,527.

(30) Foreign Application Priority Data

Jul. 24, 2007  (KR) ........................ 10-2007-0074210
May 8, 2008   (KR) ........................ 10-2008-0042895

(51) Int. Cl.
   *H01L 21/00* (2006.01)
(52) U.S. Cl.
   USPC ........... 438/109; 438/106; 438/108; 438/613; 257/778; 257/723; 257/686

(58) Field of Classification Search
   USPC ......... 438/106, 108, 613, 614, 622, 624, 109, 438/127, 629, 637, 638, 639, 640, 110, 438/612; 257/700, 690, 734, 778, 686, 777, 257/787, 791, 792, 782, 783, 774, 723, 737, 257/738, 781, 678
   See application file for complete search history.

(56) References Cited

U.S. PATENT DOCUMENTS

| 5,841,194 | A | 11/1998 | Tsukamoto | |
| 6,365,963 | B1 | 4/2002 | Shimada | |
| 8,030,752 | B2 * | 10/2011 | Ikeguchi et al. | 257/698 |
| 8,174,128 | B2 * | 5/2012 | Ikeguchi et al. | 257/778 |

(Continued)

FOREIGN PATENT DOCUMENTS

| JP | 9-162320 | 6/1997 |
| JP | 2002-343903 | 11/2002 |

OTHER PUBLICATIONS

U.S. Appl. No. 12/216,375, filed Jul. 2, 2008, Joon-Sik Shin et al., Samsung Electro-Mechanics Co., Ltd.

(Continued)

*Primary Examiner* — Thanh Y Tran

(57) ABSTRACT

A method of fabricating a semiconductor plastic package can include: providing a core board, which includes at least one pad, and which has a coefficient of thermal expansion of 9 ppm/° C. or lower; stacking a build-up insulation layer over the core board; forming an opening by removing a portion of the build-up insulation layer such that the pad is exposed to the exterior; and placing a semiconductor chip in the opening and electrically connecting the semiconductor chip with the pad. This method can be utilized to provide higher reliability in the connection between the semiconductor chip and the circuit board.

15 Claims, 12 Drawing Sheets

(56) References Cited

U.S. PATENT DOCUMENTS

| | | | |
|---|---|---|---|
| 2002/0145197 A1* | 10/2002 | Ohta et al. | 257/734 |
| 2005/0056942 A1* | 3/2005 | Pogge et al. | 257/778 |
| 2006/0043568 A1* | 3/2006 | Abe et al. | 257/698 |
| 2006/0231939 A1* | 10/2006 | Kawabata et al. | 257/686 |
| 2008/0185704 A1* | 8/2008 | Hsu et al. | 257/690 |
| 2009/0152742 A1* | 6/2009 | Ikeguchi et al. | 257/778 |

OTHER PUBLICATIONS

U.S. Patent Office Action, mailed Mar. 24, 2010, issued in corresponding U.S. Appl. No. 12/216,375.

U.S. Patent Office Action, mailed May 5, 2010, issued in corresponding U.S. Appl. No. 12/216,375.

U.S. Patent Notice of Allowance, mailed Oct. 21, 2010, issued in corresponding U.S. Appl. No. 12/216,375.

Taiwan Office Action issued Mar. 21, 2012 in corresponding Taiwan Patent Application No. 097125302.

Japanese Office Action issued Apr. 26, 2011 in corresponding Japanese Patent Application 2008-183812.

* cited by examiner

METHOD OF FABRICATING SEMICONDUCTOR PLASTIC PACKAGE INCLUDING A CORE BOARD, BUILD-UP INSULATION LAYER, PRINTED CIRCUIT, AND SEMICONDUCTOR CHIP

CROSS-REFERENCE TO RELATED APPLICATIONS

This application is a U.S. divisional application filed under 35 USC 1.53(b) claiming priority benefit of U.S. Ser. No. 12/216,375 filed in the United States on Jul. 2, 2008 now U.S. Pat. No. 7,893,527, which claims earlier priority benefit to Korean Patent Application No. 10-2008-0042895 filed with the Korean Intellectual Property Office on May 8, 2008, and Korean Patent Application No. 10-2007-0074210 filed with the Korean Intellectual Property Office on Jul. 24, 2007, the disclosures of which are incorporated herein by reference.

BACKGROUND

1. Field

The present invention relates to a semiconductor plastic package and a method of fabricating the semiconductor plastic package.

2. Description of the Related Art

Current electronic devices are trending towards smaller, thinner, and lighter products. In step with these trends, the preferred method for mounting a semiconductor chip is changing from the wire bonding method to the flip chip method, which allows a greater number of terminals. Accordingly, there is a demand also for higher reliability and higher densities in the multilayer printed circuit board to which the semiconductor chip may be mounted.

In the conventional multilayer printed circuit board, if glass fiber woven fabric is used for the base material, E-glass is generally used for the glass component. A thermosetting resin composition may be impregnated into the fiberglass woven fabric, dried, and put in a B-stage condition, which can then be processed into a copper clad laminate. This copper clad laminate can be used to fabricate a printed circuit board core, for use in the inner layers, over which B-stage resin sheets may be stacked on either side as build-up layers, to manufacture a multilayer printed circuit board.

A multilayer printed circuit board thus manufactured may include a build-up resin composition that has a high rate of thermal expansion (generally about 18 to 100 ppm/° C. in the longitudinal and lateral directions) and may include solder resists on the outermost surfaces that have an even higher rate of thermal expansion (generally about 50 to 150 ppm/° C.). Consequently, the overall coefficient of thermal expansion in the longitudinal and lateral directions for the multilayer printed circuit board may be about 13 to 30 ppm/° C. This coefficient of thermal expansion of the multilayer printed circuit board may be relatively higher than the coefficient of thermal expansion of the semiconductor chip, which generally ranges about 2 to 3 ppm/° C.

If there is a difference in the coefficients of thermal expansion between the semiconductor chip and the multilayer printed circuit board, mounting the semiconductor chip onto the multilayer printed circuit board can lead to the occurrence of defects, such as cracking in the connecting portions between the semiconductor chip and the board, and the semiconductor chip being delaminated or damaged. Also, if the semiconductor chip is placed on just one side of the board, the multilayer printed circuit board may be bent or warped.

SUMMARY

An aspect of the invention provides a semiconductor plastic package and a method of fabricating the semiconductor plastic package, which can provide high reliability in the connection between the semiconductor chip and the circuit board.

Another aspect of the invention provides a method of fabricating a semiconductor plastic package that includes: providing a core board, which includes at least one pad, and which has a coefficient of thermal expansion of 9 ppm/° C. or lower; stacking a build-up insulation layer over the core board; forming an opening by removing a portion of the build-up insulation layer such that the pad is exposed to the exterior; and placing a semiconductor chip in the opening and electrically connecting the semiconductor chip with the pad.

In certain embodiments, the method may include stacking a detachable sheet over the core board, between the operations of providing the core board and stacking the build-up insulation layer.

Forming the opening can be performed in such a way that the build-up insulation layer is disconnected.

Various embodiments of the invention can include one or more of the following features. For example, the core board can have a coefficient of thermal expansion of −20 to 7 ppm/° C. or even −15 to 5.5 ppm/° C. The core board can include any one of invar and copper-invar. The core board can also include any one of an aromatic polyamide non-woven fabric base and an aromatic polyamide woven fabric base, and can include any one of glass fiber and metal.

Also, the core board can include at least one liquid crystal polyester resin having a melting point of 270° C. or higher, which can be any one selected from a group consisting of glass fiber, aromatic polyamide fiber, and poly oxybenzol fiber.

The core board can include a carbon fiber woven fabric base, and the build-up insulation layer may be such that has a coefficient of thermal expansion of 10 to 25 ppm/° C.

The opening can be formed before or after the build-up layer is stacked over the core board. In providing the core board, a cover can be formed over the pad. In certain embodiments, the height of the semiconductor chip mounted on the pad can be equal to or smaller than the height of the opening.

Yet another aspect of the invention provides a semiconductor plastic package that includes: a core board, which includes at least one pad, and which has a coefficient of thermal expansion of 9 ppm/° C. or lower; a build-up insulation layer, which is stacked over the core board, and in which an opening is formed therein such that the pad is exposed to the exterior; and a semiconductor chip, which is held in the opening and electrically connected with the pad.

The opening can be performed in such a way that the build-up insulation layer is disconnected.

Certain embodiments of the invention can include one or more of the following features. For example, the core board can have a coefficient of thermal expansion of −20 to 7 ppm/° C., or in some embodiments, −15 to 5.5 ppm/° C.

The core board can include any one of invar and copper-invar. The core board can also include any one of an aromatic polyamide non-woven fabric base and an aromatic polyamide woven fabric base, and can include any one of glass fiber and metal.

Also, the core board can include at least one liquid crystal polyester resin having a melting point of 270° C. or higher, which can be any one selected from a group consisting of glass fiber, aromatic polyamide fiber, and poly oxybenzol fiber.

The core board can include a carbon fiber woven fabric base, and the build-up insulation layer may be such that has a coefficient of thermal expansion of 10 to 25 ppm/° C.

The height of the semiconductor chip mounted on the pad can be equal to or smaller than the height of the opening.

Additional aspects and advantages of the present invention will be set forth in part in the description which follows, and in part will be obvious from the description, or may be learned by practice of the invention.

DESCRIPTION OF EMBODIMENTS

Figure 1:
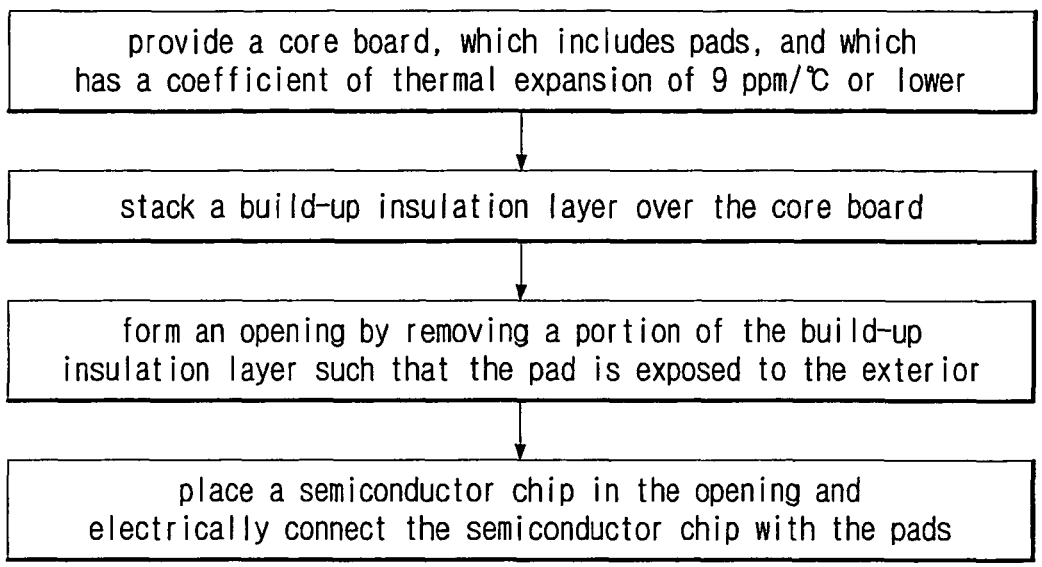
FIG. 1 is a flowchart illustrating a method of fabricating a semiconductor plastic package according to an embodiment of the invention.

As the invention allows for various changes and numerous embodiments, particular embodiments will be illustrated in the drawings and described in detail in the written description. However, this is not intended to limit the present invention to particular modes of practice, and it is to be appreciated that all changes, equivalents, and substitutes that do not depart from the spirit and technical scope of the present invention are encompassed in the present invention. In the description of the present invention, certain detailed explanations of related art are omitted when it is deemed that they may unnecessarily obscure the essence of the invention.

The terms used in the present specification are merely used to describe particular embodiments, and are not intended to limit the present invention. An expression used in the singular encompasses the expression of the plural, unless it has a clearly different meaning in the context. In the present specification, it is to be understood that the terms such as "including" or "having," etc., are intended to indicate the existence of the features, numbers, steps, actions, elements, parts, or combinations thereof disclosed in the specification, and are not intended to preclude the possibility that one or more other features, numbers, steps, actions, elements, parts, or combinations thereof may exist or may be added.

Embodiments of the present invention will be described below in detail with reference to the accompanying drawings.

FIG. 1 is a flowchart illustrating a method of fabricating a semiconductor plastic package according to an embodiment of the invention.

Referring to FIG. 1, a method of fabricating a semiconductor plastic package according to an embodiment of the invention can include providing a core board that includes pads and has a coefficient of thermal expansion of 9 ppm/° C. or lower, stacking a build-up insulation layer over the core board, forming an opening by removing a portion of the build-up insulation layer such that the pad is exposed to the exterior, and placing a semiconductor in the opening and electrically connecting the semiconductor with the pad.

In a method of fabricating the semiconductor plastic package according to this embodiment, a core board that has a relatively low rate of thermal expansion can be positioned in the center, after which semiconductor chips can be mounted on the core board. In this way, cracking or deformation, etc., can be prevented in the connecting portions between the semiconductor chip and the core board, so that the semiconductor plastic package may be produced with high reliability.

FIG. 2 through FIG. 5 are cross sectional views representing a flow diagram for a method of fabricating a core board according to an embodiment of the invention.

Figure 2:
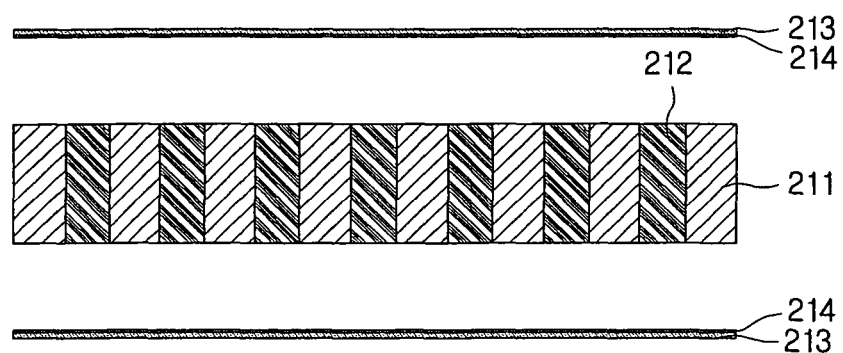
FIG. 2, FIG. 3, FIG. 4, and FIG. 5 are cross sectional views representing a flow diagram for a method of fabricating a core board according to an embodiment of the invention.
Figure 3:
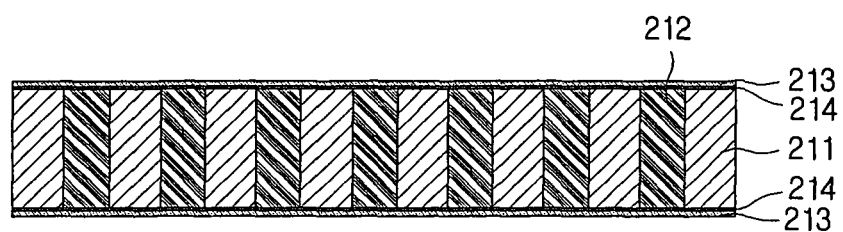

As illustrated in FIG. 2, a core material 211 can be provided, and the core material 211 can be perforated to selectively form through-holes, which can then be filled in with a resin composition 212. Next, as illustrated in FIG. 3, a copper foil 213 to which an insulating material 214 is adhered can be attached to either side of the core material 211.

Figure 4:
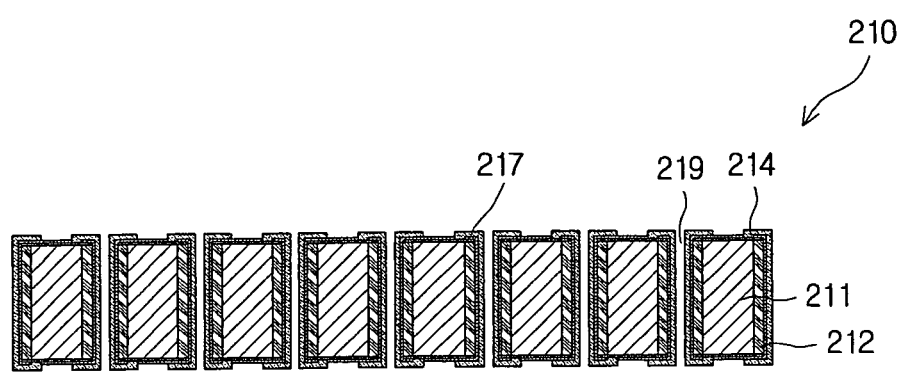

Next, as illustrated in FIG. 4, the copper foil 213 on the outer layer can be etched, and the resin composition 212 filled in the through-holes can be perforated to selectively form conductive through-holes 219. A circuit can be formed over the outer-layer copper foil 213 and the conductive through-holes 219, while the conductive through-holes 219 can be plated to allow the transfer of electrical signals.

Figure 5:
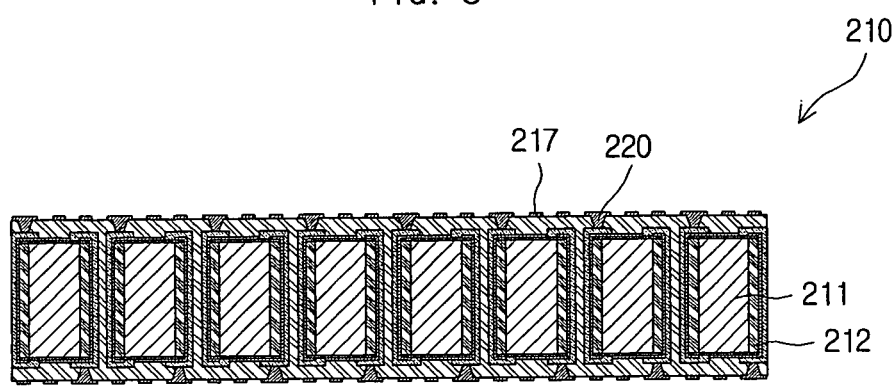

Next, as illustrated in FIG. 5, an insulation layer and a copper foil can be stacked over the core material 211, and the insulation layer and copper foil can be perforated and plated to selectively form vias 220. A circuit 217 can be formed over the copper foil and vias 220, while the vias 220 can be plated to allow the transfer of electrical signals. In this way, a core board can be formed that includes two or more layers.

Figure 6:
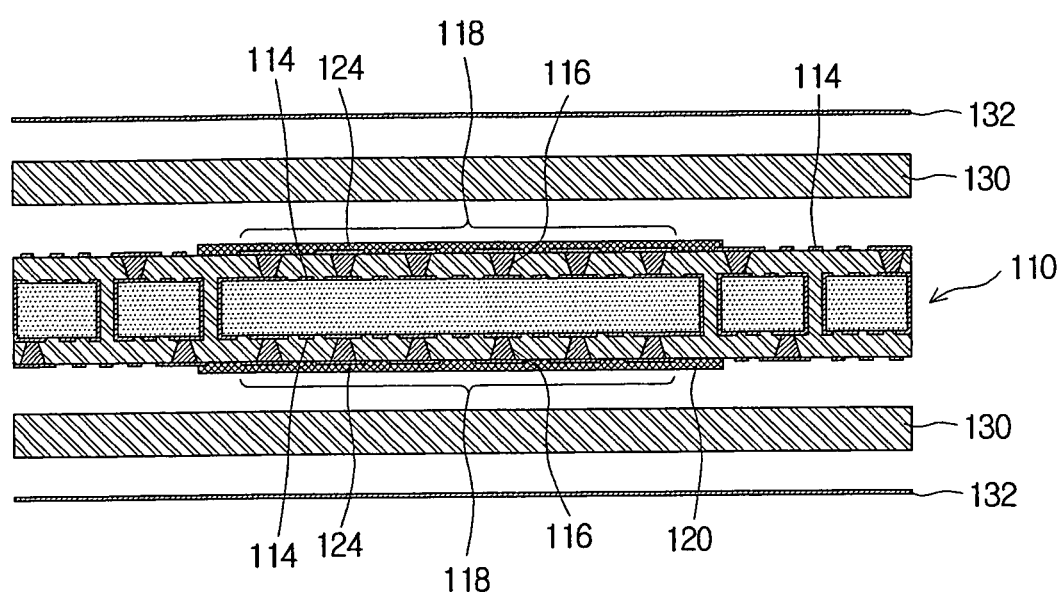
FIG. 6 is a cross sectional view illustrating the stacking of build-up insulation layers and copper foils over both sides of the core board, in a method of fabricating a semiconductor plastic package according to an embodiment of the invention.

FIG. 6 is a cross sectional view of a four-layer core board 110 having low thermal expansion properties.

In the example illustrated in FIG. 6, an inner circuit 114 can be formed over either surface of the core board 110, where the inner circuit 114 can be connected with the pads 124 by blind via holes (BVH) 116 or filling the blind via holes with copper (Cu). An access portion 118 may be formed on one or either side of the core board 110, where the access portion 118 can be composed of a multiple number of pads 124. The size of the access portion 118 can be somewhat larger than the size of the semiconductor chip (not shown) that will be mounted on later. The access portion 118 can be sealed from the exterior by a cover 120. The cover 120 may be for performing a surface treatment over the pads 124 using a metal such as gold and nickel, etc., and portions of the cover 120 may later be removed.

The core board 110 can have a rate of thermal expansion of 9 ppm/° C. or lower at conditions of −60 to 150° C. The rate of thermal expansion of a semiconductor chip is generally 2 to 4 ppm/° C., and the closer the rate of thermal expansion of the core board 110, to which the semiconductor chip is mounted, is to the rate of thermal expansion of the semiconductor chip itself, the higher will be the reliability of the semiconductor plastic package. As such, the core board 110 can have a rate of thermal expansion of −20 to 7 ppm/° C., and in some cases, −15 to 5.5 ppm/° C.

The core board 110 can be made from one of a thermosetting resin, thermoplastic resin, UV-setting resin, and an unsaturated-group-containing resin or a mixture of two or more of the above resins.

Examples of a thermosetting resin include epoxy resin, cyanate ester resin, bismaleimide resin, polyimide resin, functional-group-containing polyphenylene ether resin, cardo resin, benzocyclobutene resin, and phenol resin, etc., which can be used alone or in a combination of two or more resins. Cyanate ester resin can be used to prevent migration between closely spaced through-holes or circuits.

While a thermosetting resin according to this embodiment can be hardened by heating the resin as is, this may entail a slow hardening rate and low productivity. Thus, an adequate amount of hardening agent or thermosetting catalyst may advantageously be used in the thermosetting resin.

Various other additives may generally be used in the thermosetting resin. For example, a thermosetting resin, a thermoplastic resin, or another type of resin may be added, other than the main resin used, as well as adequate amounts of an organic or inorganic filler, a dye, pigments, a thickening agent, lubricant, an antifoaming agent, a dispersing agent, leveling agent, brightening agent, and thixotropic agent, etc., according to the purpose and usage of the composition. It is also possible to use a flame retardant, such as those using phosphorus and bromine, and non-halogenated types.

The thermoplastic resin used can be such that is generally known to those skilled in the art. More specifically, liquid crystal polyester resin, polyurethane resin, polyamide-imide resin, polyphenylene ether resin, etc., can be used by itself or in a combination of two or more resins. However, since the core board 110 may undergo a high-temperature reflow treatment during the process for mounting components, the thermoplastic resin used can be such that has a sufficiently high melting point, so as not to not incur defects in the core board 110 at the reflow temperatures. In certain examples, the melting point of the thermoplastic resin may be 270° C. or higher. The various additives described above may also be added in adequate amounts to the thermoplastic resin.

Besides the thermosetting resin and thermoplastic resin, other resins may be used alone or in combination, such as UV-setting resins, etc. Also, a photopolymerization initiator, radical polymerization initiator, and/or the various additives described above can be mixed in adequate amounts.

A non-woven or woven fabric made of inorganic or organic fibers can be included as a reinforcing base in the thermosetting resin, thermoplastic resin or UV-setting resin used in manufacturing the core board 110. Examples of inorganic fibers include E-glass fibers, T-(S-) glass fibers, NE-glass fibers, and ceramic fibers, etc. Examples of organic fibers include heat-resistant fibers such as poly oxybenzol fibers, aromatic polyamide fibers, and liquid crystal polyester fibers, etc. It is also possible to use woven or non-woven fabric in which organic and inorganic fibers are included together. A film such as polyamide film, aromatic polyamide film, liquid crystal polyester film, and poly oxybenzol film, etc., can also be used as a reinforcing base. In order to improve the adhesion between the base and the resin, a surface treatment known to those skilled in the art may be applied to the surfaces of the base material. Examples may include silane coupling agent treatment for inorganic fibers such as glass fiber fabrics, and plasma treatment, corona treatment, various chemical treatments, and blast treatment, etc., for organic materials such as film materials. In the case of film materials, copper-clad sheets may be used, in which a copper foil is attached to either side of the film by way of adhesive or attached directly by way of a method known to those skilled in the art.

The forming of the core board 110 is not limited to a particular method, and any of various generally known methods may be used, including subtractive methods and semi-additive methods, etc.

Any of various other materials other than those described above can be used for the core board 110, as long as it satisfies the condition that the core board 110 be given a coefficient of thermal expansion of 9 ppm/° C. or lower. For example, T- or S-glass fiber woven fabric, aromatic polyamide fiber non-woven or woven fabric, liquid crystal polyester resin sheets, etc., can be used. An organic insulation layer having a low rate of thermal expansion can be used in at least one layer within the core board 110, where the thickness and type of the insulation layer can be selected in consideration of the desired rate of thermal expansion of the core board 110.

Examples of inorganic materials that can be used in forming the core board 110 may include ceramics and glass. A metal layer can be formed over a surface of the core board 110 using a method such as sputtering and deposition, etc. The core board 110 can include invar or invar containing copper. Invar is an alloy of iron (Fe) and nickel (Ni) that has a coefficient of thermal expansion of 0.01 or lower at a temperature of 100° C. or lower. Small amounts of cobalt (Co), manganese (Mn), niobium (Nb), aluminum nitride (AlN), etc., can be added to the invar. Such a material may also be used after an aging process.

Referring to FIG. 6, a build-up insulation layer 130 and a copper foil 132 can be stacked sequentially over either outer side of the core board 110. The build-up insulation layers 130 can be formed selectively using a thermosetting resin, thermoplastic resin, or UV-setting resin such as that described above. The build-up insulation layer 130 may have a higher coefficient of thermal expansion compared to that of the core board 110. However, since the semiconductor chip is mounted not on the build-up insulation layer 130 but on the core board 110, which has a low coefficient of thermal expansion, the mounting of the semiconductor chip can be increased in reliability.

Figure 7:
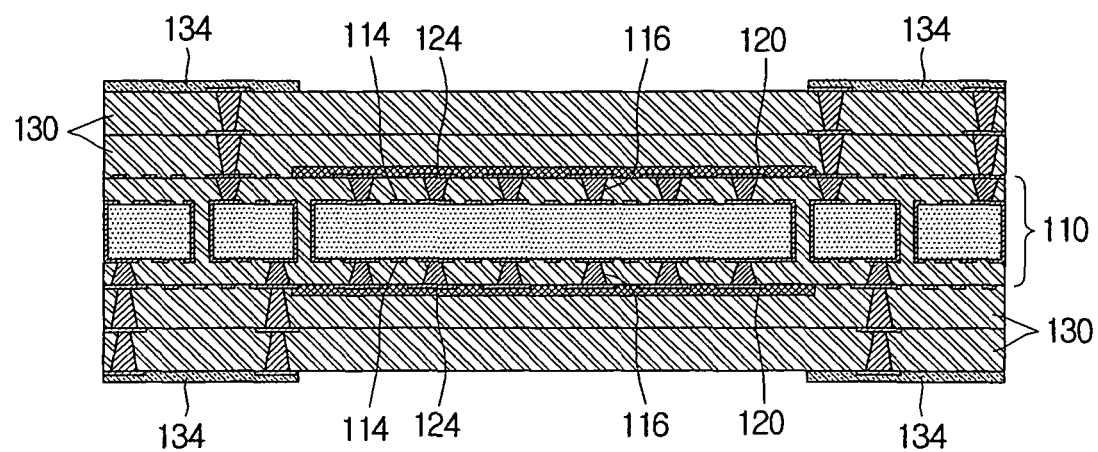
FIG. 7 is a cross sectional view after stacking the build-up insulation layers over both sides of a core board, in a method of fabricating a semiconductor plastic package according to an embodiment of the invention.

FIG. 7 is a cross sectional view of an eight-layer printed circuit board formed by stacking a build-up insulation layer 130 over either outer side of the core board 110.

Referring to FIG. 7, a build-up insulation layer 130, which may have a relatively higher rate of thermal expansion, can be stacked over either outer side of the core board 110, which may have a rate of thermal expansion of at most 9 ppm/° C. Also, a solder resist 134 can be formed over the outermost build-up insulation layer 130. Portions of the build-up insulation layer 130 can be removed in a subsequent process, whereby the access portion 118 can be exposed to the exterior.

Figure 8:
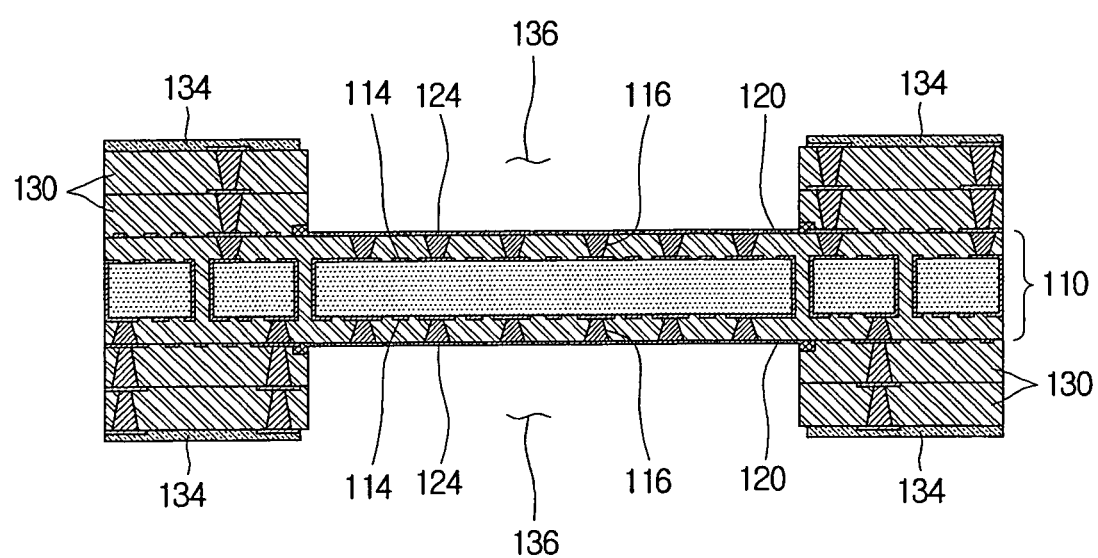
FIG. 8 is a cross sectional view after forming the openings, in a method of fabricating a semiconductor plastic package according to an embodiment of the invention.
Figure 9:
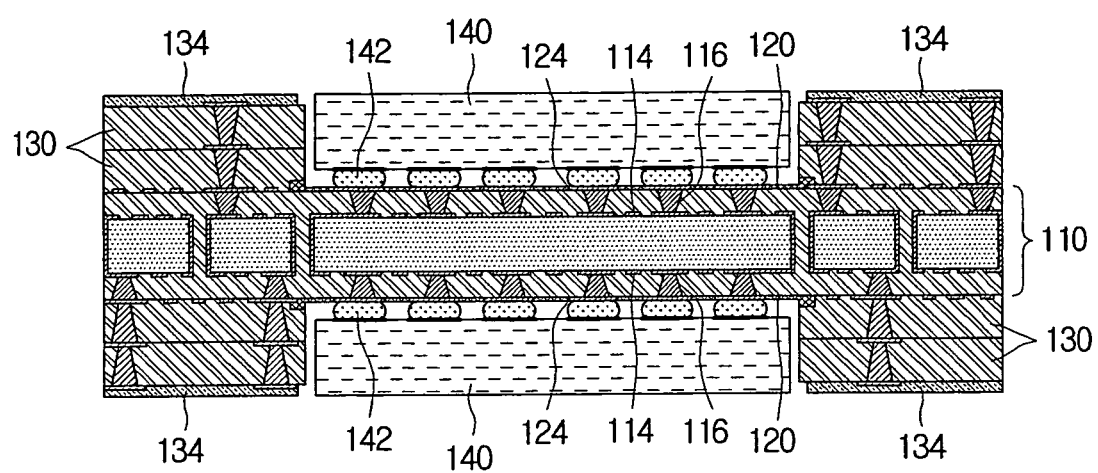
FIG. 9 is a cross sectional view of a semiconductor plastic package according to an embodiment of the invention.

FIG. 8 is a cross sectional view after forming openings 136 in the eight-layer printed circuit board illustrated in FIG. 7, and FIG. 9 is a cross sectional view after mounting semiconductor chips 140 inside the openings 136.

Referring to FIG. 8, the opening 136 can be formed somewhat larger, in comparison to the size and height of the semiconductor chip 140 (see FIG. 9) that is to be mounted on the access portion 118. After forming the opening 136, the cover 120 placed over the access portion 118 can be removed, to expose the pads 124 to the exterior. Portions of the cover 120 may remain between the pads 124.

The method of forming the opening 136 may include stacking the build-up insulation layer 130 over the core board 110 and then forming the opening 136 using a router, etc., or forming the opening 130 in the build-up insulation layer 130 beforehand and then stacking the build-up insulation layer 130 over the core board 110.

When forming the opening 136 such that the cover 120 (see FIG. 7) is exposed to the exterior, the cover 120 can be removed so that the pads 124 may be exposed to the exterior, as in the example illustrated in FIG. 8. A surface treatment may be applied to the exposed pads 124, using a metal such as gold or nickel, etc.

The surface treatment using a metal such as gold or nickel can be applied after forming the core board 110, where a detachable film, resin, or metal, etc., can be coated on in order to prevent the pads 124 from being contaminated during the surface treatment. The detachable film, resin, or metal may be removed during the procedure for forming the openings 136.

After forming the opening 136 and applying a surface treatment using a metal such as gold or nickel, etc., a semiconductor chip 140 can be mounted onto the pads 124 exposed to the exterior. Multiple solder balls 142 can be formed on the opposing side of the semiconductor chip 140, where the solder balls 142 can be electrically connected with the pads 124. Although it is possible to perform an underfill process after mounting the semiconductor chip 140, this may not be necessary in the method of manufacturing a semiconductor plastic package according to this embodiment, due to the high reliability obtained as described above. As such, a method of manufacturing a semiconductor plastic package according to this embodiment can reduce process times and costs, while providing the additional advantage of enabling repairs for a defective semiconductor chip. Also, since the semiconductor chip 140 is inserted in the opening 136, the overall thickness of the package can be decreased.

While this embodiment is described using an example in which the semiconductor chip 140 is mounted by a flip chip method, the invention is not thus limited, and various other methods may be used for connecting the semiconductor chip, such as wire bonding. Also, in cases where invar is used in the core board 110, an amount of invar tantamount to the size of the semiconductor chip can be left on the bottom of the opening 136, after which the semiconductor chip may be attached thereto using a thermally conductive adhesive such as silver paste, etc.

Figure 10:
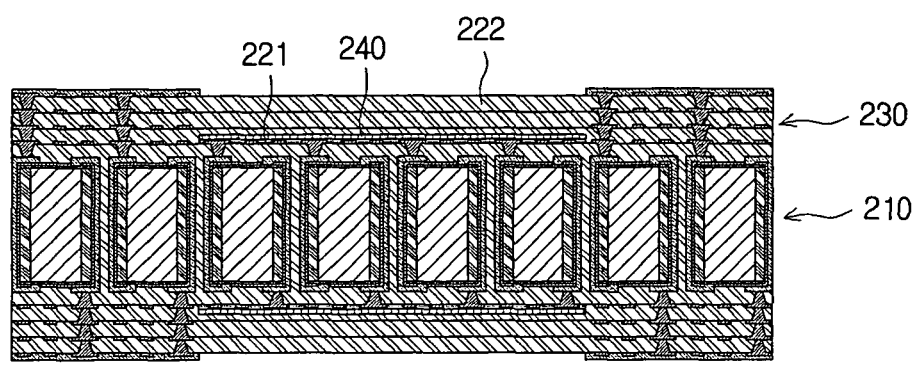
FIG. 10 is a cross sectional view after stacking the build-up insulation layers over both sides of a core board, in a method of fabricating a semiconductor plastic package according to another embodiment of the invention.
Figure 11:
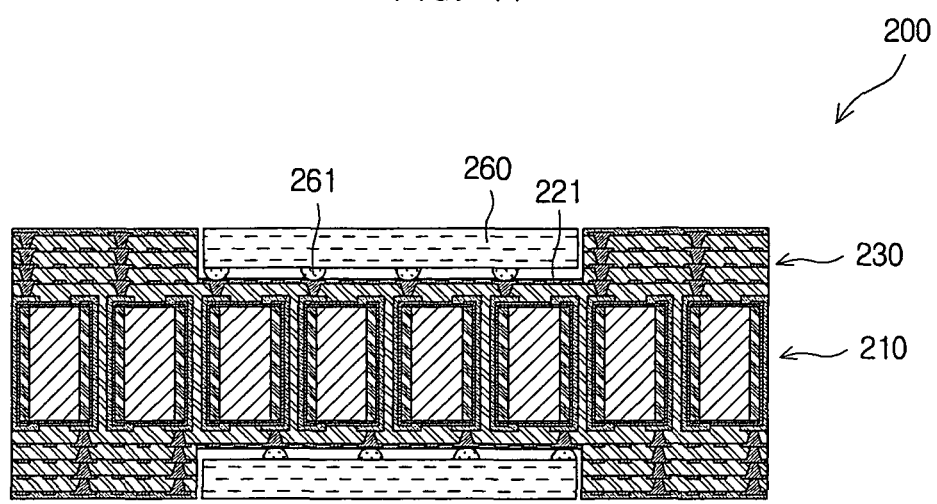
FIG. 11 is a cross sectional view of a semiconductor plastic package according to another embodiment of the invention.
Figure 12:
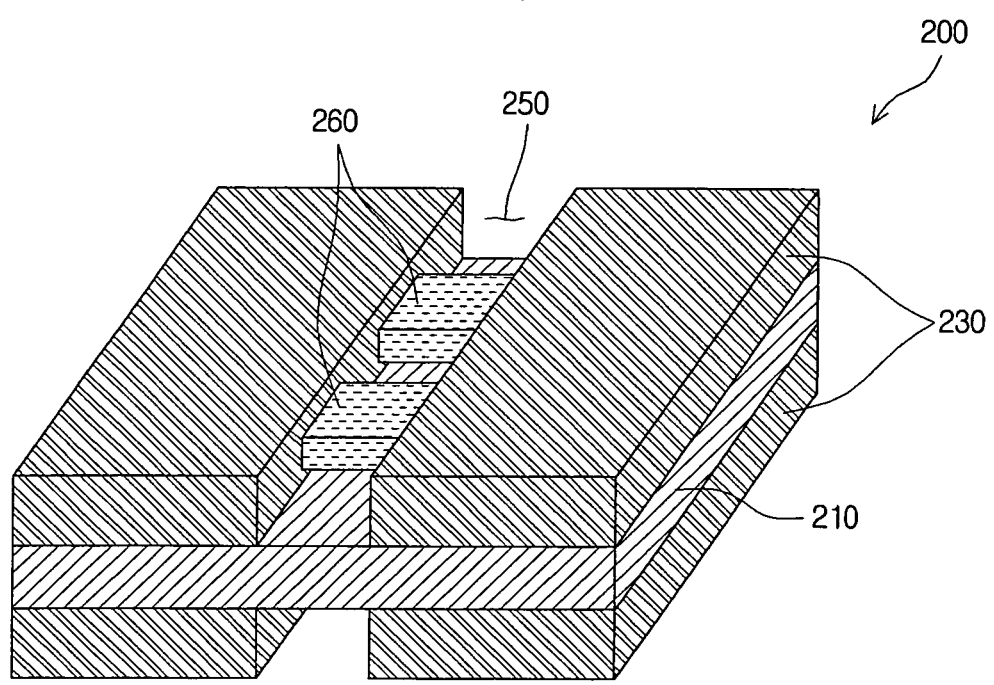
FIG. 12 is a perspective view of a semiconductor plastic package according to another embodiment of the invention.

FIG. 10 is a cross sectional view after stacking the build-up insulation layers over both sides of a core board following a method of fabricating a semiconductor plastic package according to another embodiment of the invention, while FIG. 11 is a cross sectional view of a semiconductor plastic package according to another embodiment of the invention, and FIG. 12 is a perspective view of a semiconductor plastic package according to another embodiment of the invention.

As illustrated in FIG. 10, a detachable sheet 240 can be stacked over the area of the core board 210 where the semiconductor chip 260 is to be mounted, and build-up insulation layers 230 can be stacked over the core board 210. Here, the detachable sheet 240 and build-up insulation layers 230 can be stacked on both sides of the core board 210.

Next, portions of the build-up insulation layers 230 corresponding to the detachable sheet 240 can be removed, to form an opening 250 in the build-up insulation layer 230 such that the build-up insulation layers 230 are disconnected.

That is, the detachable sheet 240 can be arranged in the area where the solder resist 221 is formed, and insulation layers 222 of prepreg, etc., can be stacked thereon. Afterwards, a copper foil can be stacked on, and the procedures for processing blind via holes, applying a desmearing treatment, plating with copper, forming circuits, and applying chemical treatment can be repeated, to fabricate a multilayer printed circuit board.

Above the portion where the detachable sheet 240 is stacked, an opening 250 can be formed in the area where the semiconductor chip 260 is to be mounted and connected, using a cutting tool, such as a laser and a router, etc., in such a way that the layers are disconnected. Openings 250 can be formed in both sides of the printed circuit board. The cutting can be performed to form openings 250 of equal area.

Stacking the detachable sheet 240 makes it possible to easily separate the build-up insulation layers 230 from the core board 210, so that the semiconductor chip 260 may be readily mounted. Also, when a problem occurs in an area of the build-up insulation layers 230 where the semiconductor chip 260 will be mounted, the problem may be conveniently removed. The detachable sheet 240 can be a film of polytetrafluoroethylene (PTFE).

A difference in area between the remaining build-up insulation layers 230, which may have a relatively high coefficient of thermal expansion, can result in bending. This may not be such a significant problem if the bending is within a predetermined range. However, it can be advantageous to have the build-up insulation layers remain with the same area, in terms of bending and warpage. Also, while the core board, which may have a low coefficient of thermal expansion, is not limited to a particular thickness, if the core board is excessively thick, stresses caused by the core board can result in damage to the semiconductor chip 260 or to the material 261 connecting the semiconductor chip. The core board can be given a thickness of 0.4 mm or greater.

Next, as illustrated in FIGS. 11 and 12, the semiconductor chip 260 can be embedded in the opening 250 and be connected with the core board 210 by flip chip mounting. The opening 250 can be formed such that the build-up insulation layers 230 are disconnected.

While the thickness of the build-up insulation layers 230 is not limited to a particular value, it can be advantageous to have the sum of the heights of the semiconductor chip 260 and the connecting material, when the semiconductor chip 260 is mounted and connected, be lower than or equal to the height of the build-up insulation layers 230 after attaching.

In this way, defects involving damage to the semiconductor chip 260 incurred by pressure, etc., from the directions of at least two of the surfaces can be avoided. Furthermore, since the semiconductor chip 260 can be mounted and connected onto the core board that has a low coefficient of thermal expansion, problems of cracking or damage, etc., in the semiconductor chip 260 or connecting material may be radically reduced. Also, since it is not necessary to use an underfill resin, the semiconductor chip 260 can be reworked, in the event of a defect, to increase benefits in terms of cost.

The semiconductor chip 260 can be mounted and connected to the inner printed circuit board having a low coefficient of thermal expansion, using a connecting material known to those skilled in the art, such as gold bumps, lead-free solder, and regular solder, etc.

When fabricating the build-up insulation layers 230, which have relatively higher coefficients of thermal expansion, it is not necessary to use only the same resin composition as disclosed above. For example, the inner core board can be implemented using a copper clad laminate made of an E-glass fiber woven fabric reinforcement base impregnated with an epoxy resin composition, while the build-up insulation material can be selected from various alternatives such as a B-stage cyanate ester resin composition having an attached copper foil without a separate reinforcement material, a B-stage unsaturated-group-containing polyphenylene ether resin sheet, and a B-stage resin sheet containing various additional materials.

It is to be appreciated that although a multilayer printed circuit board according to an embodiment of the invention may be suited for mounting a semiconductor chip 260, it is also possible to employ wire bonding.

The following will provide a more detailed illustration of embodiments of the invention by juxtaposing examples based on embodiments of the invention with comparative examples. In the following, "parts" refer to parts by weight unless otherwise specified.

EXAMPLES

Preparing a Thermosetting Resin for Examples 1 to 4

2,2-bis(4-cyanatophenyl)propane monomers of 550 parts by weight were dissolved at 160° C. and were reacted while being stirred for 4.5 hours, to yield a mixture of monomers and pre-polymers. The mixture was dissolved in methyl ethyl ketone and mixed with 100 parts by weight of a bisphenol A epoxy resin (product code: Epikote 1001, Japan Epoxy Resin Co., Ltd.), 150 parts by weight of a phenol novolac epoxy resin (product code: DEN-431, Dow Chemical Company), and 200 parts by weight of a cresol novolac epoxy resin (product code: ESCN-220 F, Sumitomo Chemical Co., Ltd.), after which 0.2 parts by weight of zinc octylate was added to the methyl ethyl ketone as a hardening catalyst. These were mixed and stirred well to provide a varnish A. Afterwards, 1500 parts by weight of a spherical silica (average particle diameter: 0.9 µm) inorganic filler was added to the varnish A, which was then stirred and dispersed to yield a varnish B.

Example 1

Manufacture of a Semiconductor Plastic Package Using an Aromatic Polyamide Fiber Woven Fabric Base in the Inner Core Board To form a build-up layer, the varnish B was impregnated into a 200 µm-thick aramid fiber woven fabric and dried, to fabricate a prepreg C having a gelation time of 133 seconds (at 170° C.) and a resin content of 44 weight %.

Also, to form another build-up layer, the varnish B was impregnated into a 100 µm-thick aramid fiber woven fabric and dried, to fabricate a prepreg D having a gelation time of 150 seconds and a resin content of 49 weight %. To form another build-up layer, the varnish B was impregnated into a 200 µm-thick aramid fiber woven fabric and dried, to fabricate a prepreg E having a gelation time of 147 seconds and a resin content of 51 weight %.

Using one sheet of the prepreg C, 12 µm-thick layers of electro-deposited copper foils were arranged on both outer sides, and were stacked and molded in a 190° C., 20 kgf/cm2, and 2 mmHg vacuum environment for 90 minutes, to fabricate a 0.2 mm-thick double-sided copper clad laminate. After etching the copper foils on both sides of the double-sided copper clad laminate to 1.5 µm, through-holes of a 100 µm diameter were formed using CO2 laser. After a desmearing treatment, an electroless-plated copper layer of 0.9 µm thickness and an electroplated copper layer of 20 µm thickness were deposited on each side, and circuits were formed using a subtractive method to line/space widths of 40/40 µm. This was followed by a CZ treatment, as provided by Meck K. K., applied to the copper layers, after which one sheet of the prepreg D was arranged on each outer side, and a 12 µm-thick electro-deposited copper foil was formed thereon. The configuration was stacked and molded in the same manner to fabricate a four-layer double-sided copper clad laminate F.

After etching the copper foils on the double-sided copper clad laminate F to a thickness of 1.2 µm, blind via holes of a 75 µm diameter were formed in both sides by way of UV-YAG laser. After a desmearing treatment, the insides of the holes were filled with copper plating. Next, circuits were formed and pads for mounting and connecting semiconductor chips were formed on both surfaces. Then, thermosetting solder resists (product code: S-220 X16K, Taiyo Ink Mfg. Co., Ltd.) were coated over the connecting portions, including the pads, to a height of 20 µm over the pads and an area of 12×12 mm, which were hardened at 150° C. for 40 minutes. After applying a CZ treatment, one 150 µm-thick sheet of the prepreg E was arranged on each outer side, and the configuration was stacked and molded in the same manner to fabricate a six-layer double-sided copper clad laminate.

After etching the copper foils on the six-layer double-sided copper clad laminate to a thickness of 1.2 µm, blind via holes of a 75 µm diameter were formed using UV-YAG laser. After a desmearing treatment, the insides of the holes were filled with copper plating. Next, circuits were formed on both sides and the procedures for CZ treatment, stacking, perforating, copper plating, and circuit forming were repeated, and solder resists (product code: PSR4000AUS308, Taiyo Ink Mfg. Co., Ltd.) were formed over the surfaces, excluding the portions for mounting the semiconductor chips, to provide an eight-layer printed circuit board G.

Openings were formed in the printed circuit board G, by processing either side with a router up to the surface of the coated solder resist, to expose the pads for mounting semiconductor chips. Each of the openings was formed 1 mm larger in each cross section compared to the semiconductor chip that will be mounted and connected, which has a thickness of 200 µm and dimensions of 10×10 mm. Afterwards, nickel plating and gold plating were performed to 5 µm and 0.2 µm, respectively, to form an eight-layer printed circuit board H. The coefficient of thermal expansion in the X and Y directions of the overall configuration, including the insulation layers and conductive materials in the portions where the semiconductor chips were to be mounted, was 4.9 to 5.2 ppm/° C. In the opening in each side of the eight-layer printed circuit board, a semiconductor chip having a thickness of 200 µm and dimensions of 10×10 mm was mounted and connected using a reflow process in which lead-free solder (Sn-3.5 Ag, melting point: 221 to 223° C.) was heated to a maximum temperature of 260° C., to yield a semiconductor plastic package I. Evaluation results for the semiconductor plastic package I are listed below in Table 1.

Example 2

Manufacture of a Semiconductor Plastic Package Using a Liquid Crystal Polyester Resin Composition in the Core Board On both sides of a 100 µm glass woven fabric, 50 µm-thick liquid crystal polyester resin sheets (product code: FA film, coefficient of thermal expansion: −7 ppm/° C., melting point: 280° C., Kuraray Co., Ltd.) were arranged, and 12 µm-thick electro-deposited copper foils were arranged on the outer sides. The configuration was stacked and molded in a 290° C., 15 kgf/cm2, 2 mmHg vacuum environment for 50 minutes and cooled, to fabricate a 0.2 mm double-sided copper clad laminate having an organic insulation layer.

After etching the copper foils on both sides of the double-sided copper clad laminate to 1.2 µm, through-holes of a 100 µm diameter were formed using CO2 laser. After a desmearing treatment, an electroless-plated copper layer of 0.9 µm thickness and an electroplated copper layer of 20 µm thickness were deposited on each side, and circuits were formed using a subtractive method to line/space widths of 40/40 µm. This was followed by a CZ treatment applied to the copper layers, after which one sheet of a 50 µm-thick liquid crystal polyester film (FA film) was arranged on either side, and 12 µm-thick electro-deposited copper foils were formed on the outer sides. The configuration was stacked and molded to fabricate a four-layer double-sided copper clad laminate.

After etching the copper foils on the four-layer double-sided copper clad laminate to a thickness of 1.2 µm, blind via holes of a 50 µm diameter were formed in both sides by way of UV-YAG laser. After a desmearing treatment using plasma, the insides of the holes were filled with copper plating.

Then, using the same build-up material as that in Example 1, and using the same processing procedures, an eight-layer printed circuit board J was fabricated. The coefficient of thermal expansion in the X and Y directions of the overall configuration, including the insulation layers and conductive materials in the portions where the semiconductor chips were to be mounted, was 1.1 to 1.3 ppm/° C. In the opening in each side, a semiconductor chip was mounted and connected using a reflow process, with lead-free solder and a maximum temperature of 260° C., to yield a semiconductor plastic package K. Evaluation results for the semiconductor plastic package K are listed below in Table 1.

Example 3

Manufacture of a Semiconductor Plastic Package Using a T-Glass Fiber Woven Fabric Base in the Core Board To the varnish B, 800 parts of silica were added and evenly dispersed, to yield a varnish L. The varnish L was impregnated into a 100 µm-thick T-(S-)glass fiber woven fabric and dried, to fabricate a prepreg M having a gelation time of 129 seconds and a resin content of 46 weight %.

Using four sheets of the prepreg M, 12 µm-thick layers of electro-deposited copper foils were arranged on both outer sides, and were stacked and molded in a 190° C., 40 kgf/cm$_2$, and 2 mmHg vacuum environment for 90 minutes, to fabricate a 0.4 mm-thick double-sided copper clad laminate. After etching the copper foils on both sides of the double-sided copper clad laminate to 1.2 µm, through-holes of a 100 µm diameter were formed using CO$_2$ laser. After a desmearing treatment, an electroless-plated copper layer of 0.9 µm thickness and an electroplated copper layer of 20 µm thickness were deposited on each side. Circuits were formed on the surfaces using a subtractive method to line/space widths of 40/40 µm, and pads were formed for connecting the semiconductor chips. Then, thermosetting solder resists (product code: S-220 X16K, Taiyo Ink Mfg. Co., Ltd.) were formed over the entirety of the surfaces to a thickness of 15 µm, and portions corresponding to the bumps were removed using UV-YAG laser, after which a plasma treatment was applied to remove resin residue remaining on the surfaces. After forming roughness over the entirety of the surfaces by applying a CZ treatment, nickel plating and gold plating were performed in the same manner as in Example 1 on only the pad portions for connecting the semiconductor chips. Each of the areas where the semiconductor chips were to be mounted was covered with an 18 µm-thick copper foil of 10×10 mm having an adhesive resin attached in the four corners. Over each of these, one layer of a thermally resistant prepreg (product code: APL-3651, Sumitomo Bakelite Co., Ltd.) was arranged, and the configuration was stacked and molded in a 200° C., 35 kgf/cm$_2$, 2 mmHg vacuum environment for 120 minutes, to fabricate a four-layer copper clad laminate. From then on, the same procedures as those used in Example 1 were performed, to fabricate an eight-layer printed circuit board N.

Here, openings were formed using a router, up to the surfaces of the copper foils attached in the areas where the semiconductor chips were to be mounted, to a size of 11×11 mm. The cover copper foils on both sides were removed, without damaging the gold plating, to expose the pads. The coefficient of thermal expansion in the X and Y directions of the overall configuration, including the insulation layers and conductive materials in the portions where the semiconductor chips were to be mounted, was 6.8 to 7.0 ppm/° C. In the opening in either side, a semiconductor chip was mounted and connected using a reflow process, with lead-free solder and a maximum temperature of 260° C., to yield a semiconductor plastic package O. Evaluation results for the semiconductor plastic package O are listed below in Table 1.

Example 4

The varnish B was impregnated into a 100 µm-thick T-glass fiber woven fabric and dried, to fabricate a prepreg P having a gelation time of 106 seconds (at 170° C.) and a resin content of 46 weight %.

Using two sheets of the prepreg P, copper-invar foils (coefficient of thermal expansion: 1.9 ppm/° C. having thicknesses of Cu/Invar/Cu=1/35/1 µm and having minute roughness applied on the surfaces were arranged on both sides, and were stacked and molded as in Example 1, to fabricate a 0.2 mm-thick double-sided metal clad laminate. Through-holes of a 150 µm diameter were formed in this metal clad laminate using a diamond drill, and after a desmearing treatment, copper layers of 722 Å were deposited by sputtering. Then, an electroless-plated copper layer of 0.5 µm thickness and an electroplated copper layer of 15 µm thickness were deposited on each side. Circuits were formed on the surfaces to line/space widths of 80/80 µm, and pads were formed for connecting the semiconductor chips. In the portions for mounting the semiconductor chips, the thermosetting solder resists used in Example 1 were coated to a thickness of 15 µm in areas slightly larger (12×12 mm) than the size of the semiconductor chips (10×10 mm). The solder resists were heated and hardened, and a CZ treatment was applied. Then, one layer of the prepreg APL-3651 used in Example 3 was arranged to a thickness of 70 µm on either side, and the configuration was stacked and molded in like manner to fabricate a four-layer copper clad laminate.

Then, using the same build-up material as that in Example 1, and using the same processing procedures, an eight-layer printed circuit board Q was fabricated. The coefficient of thermal expansion in the X and Y directions of the overall configuration, including the insulation layers and conductive materials in the portions where the semiconductor chips were to be mounted, was 7.4 to 7.7 ppm/° C. In the opening in each side, a semiconductor chip was mounted and connected in like manner, to yield a semiconductor plastic package R. Evaluation results for the semiconductor plastic package R are listed below in Table 1.

Example 5

An eight-layer printed circuit board was fabricated similar to the eight-layer printed circuit board in Example 4, but structured to have a semiconductor chip mounted and connected on one side only. An opening was formed in one side up to the core board having a low rate of thermal expansion, and the semiconductor chip was mounted and connected in the same manner but in one side. Evaluation results for this semiconductor plastic package are listed below in Table 1.

The connecting of the semiconductor chip is not limited to methods described above, and various other known methods can be used. Moreover, the procedures for fabricating a printed circuit board are not limited to those described above, and various other known fabrication procedures can be used.

Using the above semiconductor plastic packages, in which semiconductor chips were mounted and connected, temperature cycle tests were performed for 1000 cycles of −40° C./30 min.←→125° C./30 min. The evaluation results are listed below in Table 1.

Comparative Examples 1, 2, 3

Eight-layer printed circuit boards S, T, and U were fabricated, which are similar to the eight-layer printed circuit boards H, J, and N in Examples 1, 2, and 3, respectively, except that the solder resists were not formed on the core boards and that the openings were not formed. To each of these printed circuit boards, semiconductor chips were mounted and connected on both sides, and evaluation tests were performed. The evaluation results are listed below in Table 2.

Comparative Example 4

Using electro-deposited copper foils of equal thickness instead of the layers of copper-invar in Example 4, an eight-layer printed circuit board V was fabricated in a similar manner, except that the solder resists were not formed on the core boards and that the openings were not formed. Semiconductor chips were mounted and connected on both sides, and evaluation tests were performed. The evaluation results are listed below in Table 2.

Comparative Example 5

An eight-layer printed circuit board was fabricated similar to the eight-layer printed circuit board in Comparative Example 4, but structured to have a semiconductor chip mounted and connected on one side only. A semiconductor chip was mounted and connected in the same manner but in one side. Evaluation results for this semiconductor plastic package are listed below in Table 2.

Comparative Example 6

For a copper clad laminate (product name: ELC-4785 GS, CTEα1: 11 ppm/° C., Sumitomo Bakelite Co., Ltd.) having a 12 μm-thick electro-deposited copper foil attached on either side of a 0.2 mm-thick insulation layer of epoxy, the copper of the surface layers were etched to a thickness of 1.3 μm. Then, through-holes were formed using a metal drill to a diameter of 150 μm. After a desmearing treatment, an electroless-plated copper layer of 0.9 μm thickness and an electroplated copper layer of 20 μm thickness were deposited on each side, and circuits were formed using a subtractive method to line/space widths of 40/40 μm. This was followed by a black oxide treatment, after which one sheet of the prepreg E having a thickness of 150 μm was arranged on each outer side, and 12 μm-thick electro-deposited copper foils were formed over the outer sides. The configuration was stacked and molded in a 200° C., 25 kgf/cm$_2$, and 2 mmHg vacuum environment for 90 minutes, to fabricate a four-layer double-sided copper clad laminate.

After etching the copper foils on the surfaces of this double-sided copper clad laminate to a thickness of 1.2 μm, blind via holes of an 80 μm diameter were formed in both sides by way of UV-YAG laser. After a desmearing treatment, the insides of the holes were filled with copper plating, and circuits were formed on both surfaces. The procedures after the black oxide treatment were then repeated, to fabricate a six-layer printed circuit board W, and a CZ treatment, as provided by Meck K. K., was applied to form a six-layer printed circuit board X. The rate of thermal expansion in the portions of the printed circuit board W where semiconductor chips were to be mounted and connected was 16.7 ppm/° C.

On each side of the printed circuit board X, one layer of prepreg having an aramid fiber woven fabric base, of which the coefficient of thermal expansion after hardening is 8.8 ppm/° C. and of which the thickness is 105 μm, was arranged, and 12 μm-thick electro-deposited copper foils were arranged on the outer sides. The configuration was stacked and molded in a 190° C., 25 kgf/cm$_2$, 2 mmHg vacuum environment for 90 minutes, to fabricate a double-sided eight-layer copper clad laminate. Then, blind via holes of an 80 μm diameter were formed using UV-YAG laser. After a desmearing treatment, the insides of the holes were filled with copper plating, and circuits were formed on both sides. Procedures for forming solder resists, nickel plating, and gold plating were performed in a similar manner, to provide a printed circuit board Y. A semiconductor chip was mounted and connected in the same manner in one side, to fabricate a semiconductor plastic package Z. Evaluation results for this semiconductor plastic package are listed below in Table 2.

TABLE 1

Evaluation Results for Examples 1 to 5

|  | Example 1 | Example 2 | Example 3 | Example 4 | Example 5 |
| --- | --- | --- | --- | --- | --- |
| Semiconductor Chip Mounted | Both Sides | Both Sides | Both Sides | Both Sides | One Side |
| Connection Material Between Semiconductor Chip and Printed Circuit Board | | Lead-Free Solder Balls | | | |
| Thickness Including Flip Chip (μm) | 1.1 | 1.0 | 1.2 | 1.1 | 1.1 |
| Bending and Warpage (μm) | 102 | 116 | 105 | 99 | 125 |
| Number of Samples Devoid of Cracking or Delamination Defects (n/20) | 20 | 20 | 20 | 20 | 20 |

TABLE 2

| Evaluation Results for Comparative Examples 1 to 6 | | | | | | |
|---|---|---|---|---|---|---|
| | Comparative Example 1 | Comparative Example 2 | Comparative Example 3 | Comparative Example 4 | Comparative Example 5 | Comparative Example 6 |
| Semiconductor Chip Mounted Connection Material Between Semiconductor Chip and Printed Circuit Board | Both Sides | Both Sides | Both Sides | Both Sides Lead-Free Solder Balls | One Side | One Side |
| Thickness Including Flip Chip (μm) | 1.7 | 1.6 | 1.8 | 1.7 | 1.4 | 1.4 |
| Bending and Warpage (μm) | 125 | 130 | 118 | 111 | 312 | 219 |
| Number of Samples Devoid of Cracking or Delamination Defects (n/20) | 9 | 11 | 6 | 12 | 10 | 15 |

Measurement Method (1) Total Thickness Including Semiconductor Chip

The total thickness of the semiconductor plastic package, including the semiconductor chip, was measured and rounded off to the first decimal point.

(2) Bending and Warpage

For twenty 40×100 mm module samples, each having two components of dimensions 10×10 mm and thickness 200 μm connected to the left, right, and middle (for a total of six) on both sides, the bending and warpage were measured using a laser measurement apparatus. The initial printed circuit boards selected displayed bending and warpage of 50±5 μm. The maximum values of bending and warpage were measured using a laser measurement apparatus after mounting and connecting the components.

(3) Number of Cracking or Delamination Defects

For twenty 40×100 mm module samples, each having two components of dimensions 10×10 mm and thickness 200 μm connected to the left, right, and middle (for a total of six) on both sides, temperature cycle tests were performed for cycles of −40° C./30 min.↔125° C./30 min. After 1000 cycles, the integrity of the connection was evaluated. Here, a change in resistance value of ±15% or more was classified as a defect. The samples were also checked for cracking and delamination in the solder. The number of flawless products was recorded.

As observed in Table 1 and Table 2 above, the Examples based on embodiments of the invention are thinner and have fewer cases of bending, warpage, and cracking defects than do the Comparative Examples.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of fabricating a semiconductor plastic package, the method comprising:
   providing a core board, the core board comprising a pad, having a coefficient of thermal expansion of 9 ppm/° C. or lower and filled in selectively formed through-holes with a resin composition;
   stacking a build-up insulation layer over the core board and forming a printed circuit on the build-up insulation layer, a coefficient of thermal expansion of the build-up insulation layer being higher than that of the core board;
   forming an opening by removing a portion of the build-up insulation layer such that the pad is exposed to the exterior; and
   placing a semiconductor chip in the opening and electrically connecting the semiconductor chip with the pad.

2. The method of claim 1, further comprising, between the providing of the core board and the stacking of the build-up insulation layer:
   stacking a detachable sheet over the core board.

3. The method of claim 1, wherein the forming of the opening is performed such that the build-up insulation layer is disconnected.

4. The method of claim 1, wherein the core board has a coefficient of thermal expansion of −20 to 7 ppm/° C.

5. The method of claim 1, wherein the core board comprises any one of invar and copper-invar.

6. The method of claim 1, wherein the core board comprises any one of an aromatic polyamide non-woven fabric base and an aromatic polyamide woven fabric base.

7. The method of claim 1, wherein the core board comprises any one of glass fiber and metal.

8. The method of claim 1, wherein the core board comprises a liquid crystal polyester resin having a melting point of 270° C. or higher.

9. The method of claim 8, wherein the liquid crystal polyester resin comprises any one selected from a group consisting of glass fiber, aromatic polyamide fiber, and poly oxybenzol fiber.

10. The method of claim 1, wherein the core board comprises a carbon fiber woven fabric base.

11. The method of claim 1, wherein the build-up insulation layer has a coefficient of thermal expansion of 10 to 25 ppm/° C.

12. The method of claim 1, wherein the opening is formed after the build-up insulation layer is stacked over the core board.

13. The method of claim 1, wherein the opening is formed before the build-up insulation layer is stacked over the core board.

14. The method of claim 1, wherein in providing the core board, a cover is formed over the pad.

15. The method of claim 1, wherein the semiconductor chip mounted on the pad has a height equal to or smaller than that of the opening.

* * * * *

UNITED STATES PATENT AND TRADEMARK OFFICE
CERTIFICATE OF CORRECTION

PATENT NO. : 8,647,926 B2  
APPLICATION NO. : 12/923081  
DATED : February 11, 2014  
INVENTOR(S) : Shin et al.

Page 1 of 1

It is certified that error appears in the above-identified patent and that said Letters Patent is hereby corrected as shown below:

On the Title Page Item [75] (Inventors), Line 3, delete "Joung Gul" and insert -- Joung-Gul --, therefor.

Signed and Sealed this  
First Day of July, 2014

Michelle K. Lee  
*Deputy Director of the United States Patent and Trademark Office*